(12) United States Patent
Sundararajan (10) Patent No.: US 9,082,735 B1
(45) Date of Patent: Jul. 14, 2015

(54) 3-D SILICON ON GLASS BASED ORGANIC LIGHT EMITTING DIODE DISPLAY

(71) Applicant: Srikanth Sundararajan, Pleasanton, CA (US)

(72) Inventor: Srikanth Sundararajan, Pleasanton, CA (US)

(*) Notice: Subject to any disclaimer, the term of this patent is extended or adjusted under 35 U.S.C. 154(b) by 0 days.

(21) Appl. No.: 14/522,883

(22) Filed: Oct. 24, 2014

Related U.S. Application Data (60) Provisional application No. 62/037,224, filed on Aug. 14, 2014.

(51) Int. Cl.
| | | |
|---|---|---|
| *H01L 29/08* | (2006.01) | |
| *H01L 51/00* | (2006.01) | |
| *H01L 27/32* | (2006.01) | |
| *H01L 51/52* | (2006.01) | |
| *H01L 49/02* | (2006.01) | |
| *H01L 29/786* | (2006.01) | |

(Continued)

(52) U.S. Cl.
CPC ........ *H01L 27/3276* (2013.01); *H01L 27/3209* (2013.01); *H01L 27/3246* (2013.01); *H01L 27/3248* (2013.01); *H01L 27/3251* (2013.01); *H01L 27/3258* (2013.01); *H01L 27/3262* (2013.01); *H01L 28/40* (2013.01); *H01L 29/7816* (2013.01); *H01L 29/78654* (2013.01); *H01L 29/792* (2013.01); *H01L 51/5206* (2013.01); *H01L 51/5209* (2013.01); *H01L 51/5225* (2013.01); *H01L 51/5265* (2013.01); *H01L 51/5275* (2013.01); *H01L 51/5278* (2013.01); *H01L 51/5287* (2013.01); *H01L 2251/556* (2013.01); *H01L 2251/558* (2013.01)

(58) Field of Classification Search
CPC ............ H01L 27/3246; H01L 27/3248; H01L 27/3251; H01L 27/3258; H01L 27/3209; H01L 27/1214; H01L 27/3276; H01L 2251/5315; H01L 51/50; H01L 51/5209; H01L 51/5225; H01L 51/5278; H01L 51/5287; G09G 2300/0819; G09G 2300/0847
See application file for complete search history.

(56) References Cited

U.S. PATENT DOCUMENTS

| | | | |
|---|---|---|---|
| 7,501,682 B2 * | 3/2009 | Choi et al. | ..................... 257/321 |
| 7,750,564 B2 | 7/2010 | Lee et al. | |

(Continued)

OTHER PUBLICATIONS

Siew-Chong Tan, General n-Level Driving Approach for Improving Electrical-to-Optical Energy-Conversion Efficiency of Fast-Response Saturable Lighting Devices, Journal, Apr. 2010, 1342-1353, vol. 57—No. 4, IEEE, United States of America.

(Continued)

*Primary Examiner* — Jesse Y Miyoshi
(74) *Attorney, Agent, or Firm* — Plager Schack LLP (57) ABSTRACT

An organic light emitting display includes an organic light emitting diode that further includes an anode metal connected to a transparent cathode. An organic diode stack further comprising: electron-transport layer, hole transport layer and the emission layer organized into deep trench high aspect ratio structures in a bottom plane of the organic light emitting display and sandwiched between and the anode and cathode layers described above. A first stratum of thin transparent silicon that is attached to a diode plane in the organic light emitting display through a high aspect ratio via. A second stratum of thin transparent silicon that is attached to the first stratum and forming addressing transistors for the devices on the first strata. The organic light emitting diode emits light in response to bias voltages existing on the first and second strata that is extracted through a sub-pixel pitch microlens film deposited on the glass substrate.

7 Claims, 7 Drawing Sheets

(51) Int. Cl.
*H01L 29/792* (2006.01)
*H01L 29/78* (2006.01)

(56) References Cited

U.S. PATENT DOCUMENTS

| | | | | |
|---|---|---|---|---|
| 8,030,656 | B2* | 10/2011 | Chung | 257/71 |
| 8,120,095 | B2 | 2/2012 | Ho et al. | |
| 8,184,486 | B2* | 5/2012 | Lin et al. | 365/185.23 |
| 8,232,598 | B2* | 7/2012 | Yamazaki et al. | 257/351 |
| 8,674,481 | B2 | 3/2014 | Droes et al. | |
| 2004/0140757 | A1* | 7/2004 | Tyan et al. | 313/504 |
| 2006/0131570 | A1* | 6/2006 | Meng | 257/40 |
| 2007/0085115 | A1* | 4/2007 | Chen et al. | 257/291 |
| 2007/0132061 | A1 | 6/2007 | Chen et al. | |
| 2010/0149138 | A1* | 6/2010 | Lee et al. | 345/204 |
| 2015/0014634 | A1* | 1/2015 | Kim | 257/40 |

OTHER PUBLICATIONS

Swift et al., An Embedded 90nm SONOS Nonvolatile Memory Utilizing Hot Electron Programming and Uniform Tunnel Erase, Symposium, Dec. 2002, 927-930, IEEE, United States of America.

Gadkaree et al., Single-crystal silicon films on glass, Journal, Sep. 2007, 2363-2367, vol. 22—No. 9, Materials Research Society, United States of America.

Kamalasanan et al., Organic Light Emitting Diode for White Light Emission, Book, Aug. 2010, 179-224, Sciyo, China.

Vandersteegen et al., Light extraction for a doubly resonant cavity organic LED: the RC2LED, Article, Sep. 2007, vol. 6655—No. 13, SPIE, United States of America.

Brain et al., A 22nm High Performance Embedded DRAM SoC Technology Featuring Tri-gate Transistors and MIMCAP COB, Symposium, 2012, 3.1.1-3.1.4, IEEE, United States of America.

* cited by examiner

3-D SILICON ON GLASS BASED ORGANIC LIGHT EMITTING DIODE DISPLAY

RELATED APPLICATION

This application claims priority to provisional patent application U.S. Ser. No. 62/037,224 filed on Aug. 14, 2014, the entire contents of which is herein incorporated by reference.

BACKGROUND

The embodiments herein relate generally to devices that have electrical conductivity of that between a conductor and an insulator.

Some other endeavors in this field include *Light extraction for a doubly resonant cavity organic LED: the RC2LED* published by Vandersteegen, et al; *General n-Level Driving Approach for Improving Electrical-to-Optical Energy-Conversion Efficiency of Fast-Response Saturable Lighting Devices* published by Tan; *An Embedded 90 nm SONOS Nonvolatile Memory Utilizing Hot Electron Programming and Uniform Tunnel Erase* published by Swift et al.; *Single-crystal silicon films on glass* published by Gadkaree; *Organic Light Emitting Diode for White Light Emission* published by Kamalasanan, et al.; *A 22 nm High Performance Embedded DRAM SoC Technology Featuring Tri-gate Transistors* and *MIMCAP COB* published by Brain et al.; U.S. Pat. No. 7,750,564 issued to Lee; U.S. Pat. No. 8,120,095 issued to Ho; U.S. Patent application 2007/0132061 filed by Chen; and U.S. Pat. No. 8,674,481.

Kamalasanan explains that recent developments in organic light emitting diodes have led brighter organic light emitting diodes that use less energy.

Vandersteegen explains that adding three additional interference layers between the indium tin oxide electrode and the glass substrate enables an improvement of extraction efficiency in an organic light emitting diode. Lee is similar talking about an additional arrangement of layers.

Tan teaches that an n-level type of driving approach to be adopted in the design and construction of power-electronic drivers for fast-response saturable lighting devices to achieve a quasi-optimal lighting efficacy.

Swift teaches a compact SONOS Flash EEPROM device with fast programming, high reliability, and uniform erase. Ho is similar, but adds that having a trench depth of 1-2 microns offers further benefits.

Gadkaree teaches a process for putting silicon on glass. Chen adds that a metal-insulator metal capacitor can be added to a system. Droers teaches attaching fabricated circuits to receiver substrates.

Prior to embodiments of the disclosed invention, organic light emitting diodes suffered from lifetime degradation with increasing current densities which occur when pixel area is scaled to increase pixel areal density. Embodiments of the disclosed invention solve this problem.

Prior to embodiments of the disclosed invention organic light emitting diode displays consumed more than two watts of power for a greater than 90% white image and could not support 120 frames per second video frame rates in a transparent and flexible form factor. Embodiments of the disclosed invention solve this problem.

SUMMARY

An organic light emitting display includes an organic light emitting diode that further includes an anode metal connected to a transparent cathode made of indium tin oxide with a layer of organic thin films stacked in-between. An organic diode stack further comprising: electron-transport layer, hole transport layer and the emission layer organized into deep trench high aspect ratio structures in a bottom plane of the organic light emitting display. A first stratum of thin transparent silicon that is attached to a diode plane in the organic light emitting display through a high aspect ratio via. A second stratum of thin transparent silicon that is attached to the first stratum and forming the addressing transistors for the devices on the first strata. The organic light emitting diode emits light in response to bias voltages existing on the first and second strata.

BRIEF DESCRIPTION OF THE FIGURES

The detailed description of some embodiments of the invention is made below with reference to the accompanying figures, wherein like numerals represent corresponding parts of the figures.

DETAILED DESCRIPTION OF CERTAIN EMBODIMENTS

Figure 1:
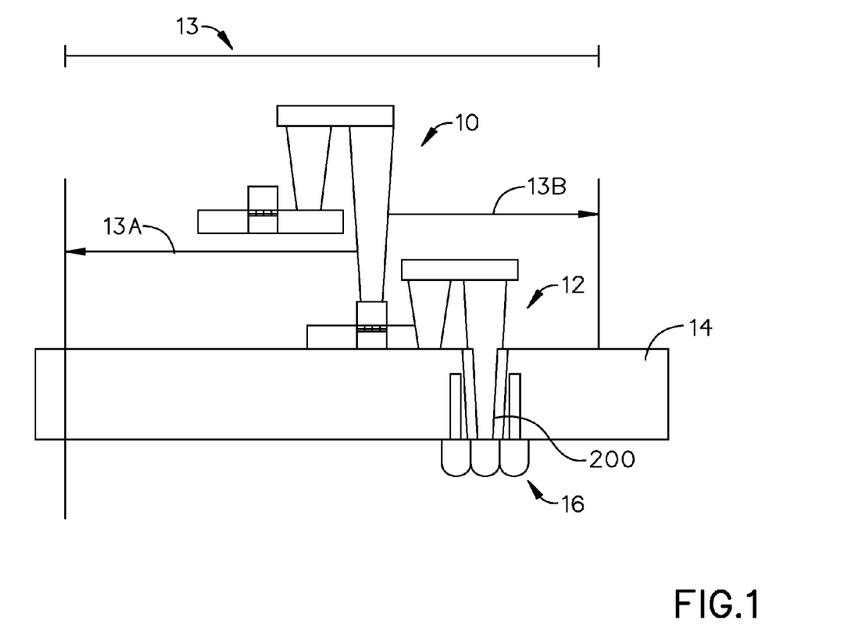
FIG. 1 is a schematic view of an embodiment of the invention.
Figure 3:
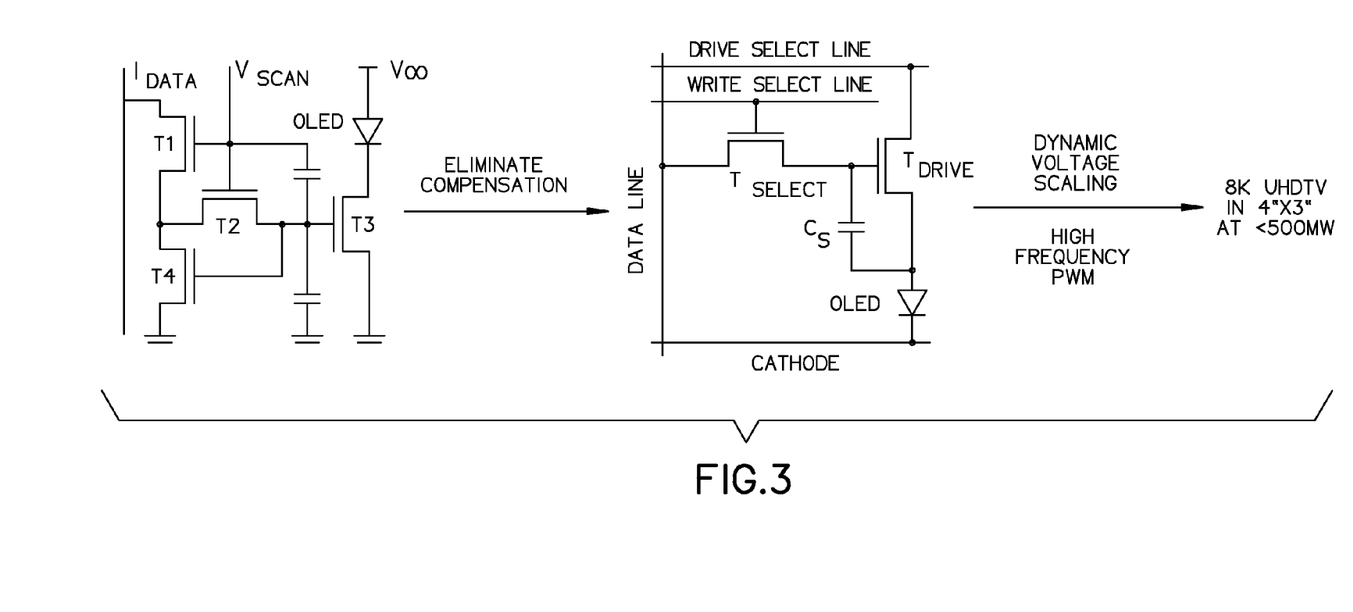
FIG. 3 is a schematic view of an embodiment of the invention.
Figure 4:
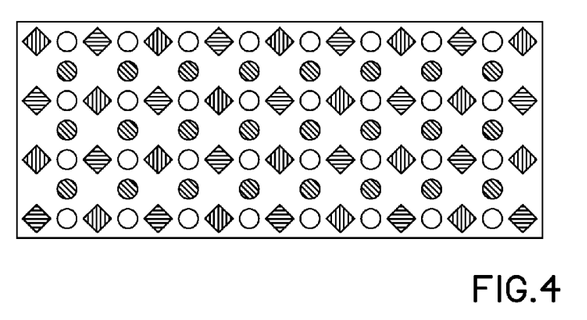
FIG. 4 is a detail view an exemplary RGBW display layout.
Figure 5:
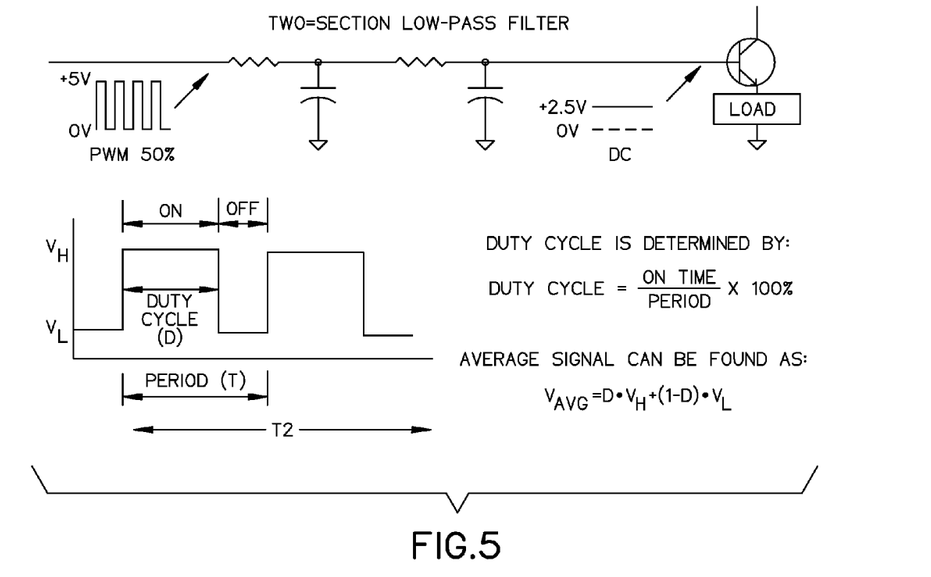
FIG. 5 is a schematic view of the pulse width modulation.
Figure 6:
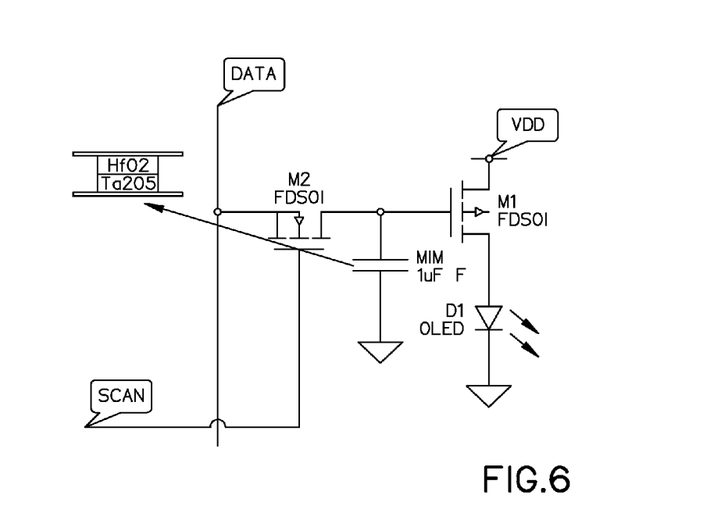
FIG. 6 is a schematic view of a non-compensated pixel design.
Figure 7:
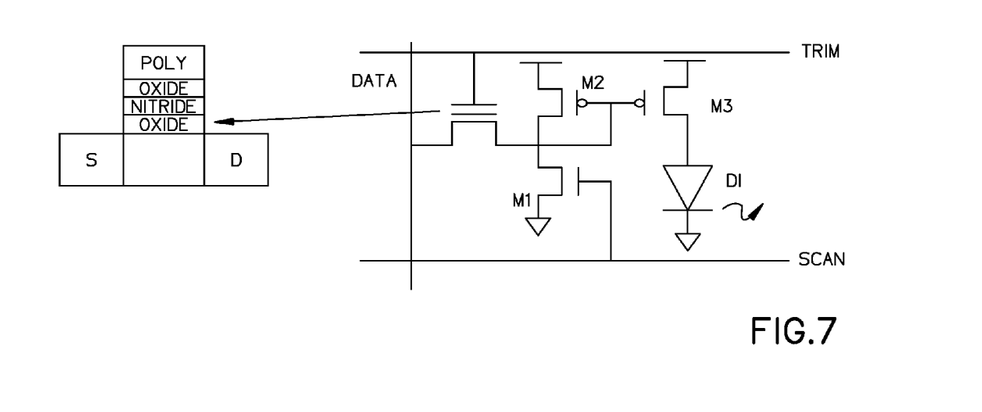
FIG. 7 is a schematic view of a compensated pixel design.
Figures 8, 9, 10, 11:
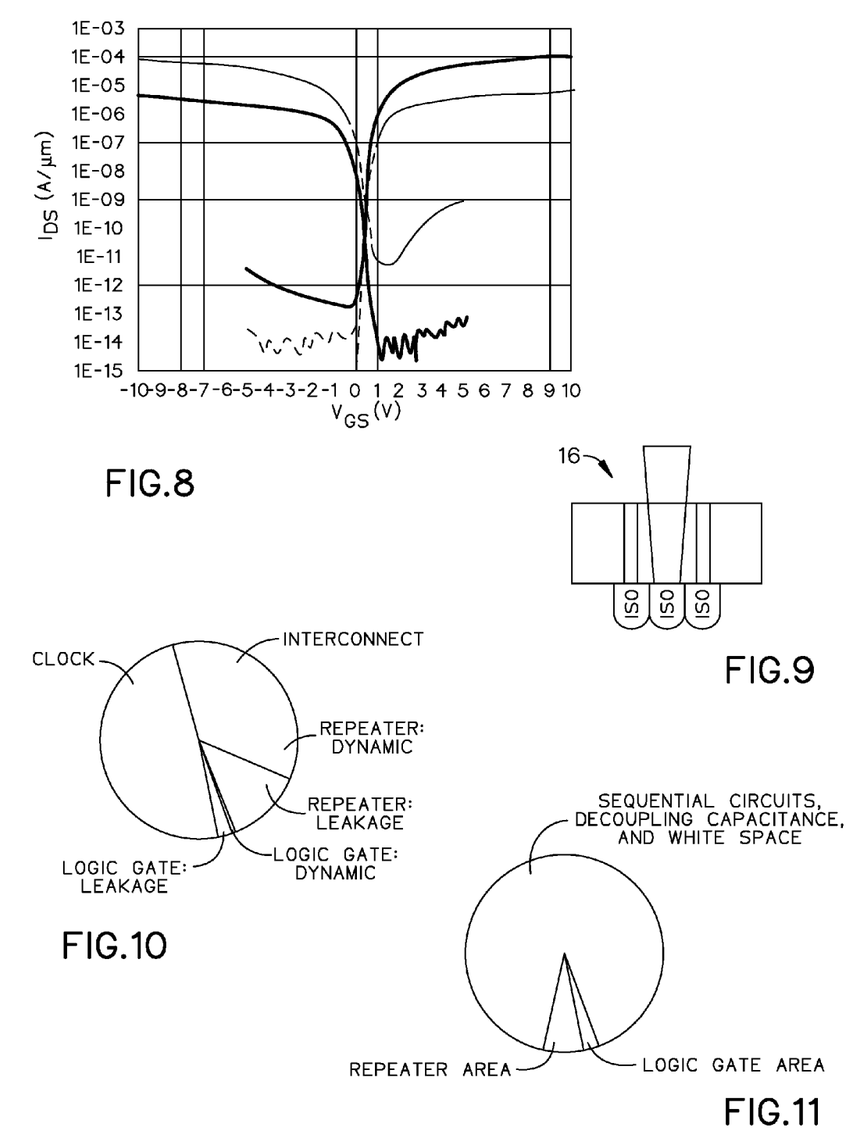
FIG. 8 is a graph of the transistor metric.
FIG. 9 is a schematic view of an embodiment of the invention.
FIG. 10 is a graph of the power consumption.
FIG. 11 is a graph of the area distribution.
Figure 12:
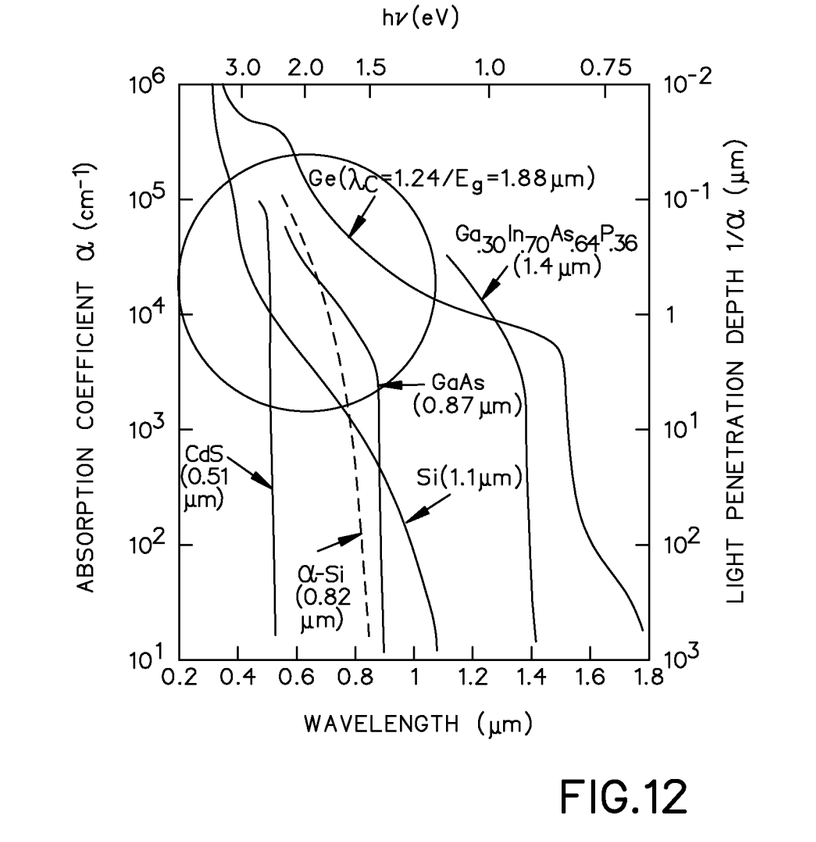
FIG. 12 is a graph of the penetration depth of silicon.

By way of example, one embodiment of the organic light emitting display comprises a plurality of organic light emitting diodes, one of which is shown in FIG. 1. Each organic light emitting diode can be made with the process shown in FIG. 2. Once made, the organic light emitting diode is wired to a series of voltage and current sources as shown in FIG. 3. Each organic light emitting diode is then arranged in an active matrix of red, blue and yellow organic light emitting diode forming an active matrix organic light emitting display as shown in FIG. 4. Once created, the active matrix organic light emitting display can be modified in several ways. First, pulse width modulation of a voltage circuit can occur as shown in FIG. 5. Next, a user can configured either a non-compensated pixel design as shown in FIG. 6 or a compensated pixel design as shown in FIG. 7. Once formed, the active matrix organic light emitting display has properties that are shown in FIG. 10, FIG. 11 and FIG. 12.

Turning in more detail to FIG. 1, the organic light emitting diode comprises first stratum 10 can be made from thin transparent silicon and attached to a glass substrate 14 in the organic light emitting display through a set of high aspect ratio vias containing organic light emitting diode stacks. As used in this application a high aspect ratio is greater than 10. First stratum 10 is joined to second stratum 12 containing a plurality of organic light emitting diodes. Each organic diode further comprises a three layer organic diode stack containing an electron-transport layer, hole transport layer and the emission layer organized into deep trench high aspect ratio structures in a bottom plane of the organic light emitting display. The three layer organic diode stack is joined to an anode metal connected to a transparent cathode made of indium tin oxide. Glass 14 can have a thickness of 5-10 μm achieved after manufacturing etchback. A final hemispherical microlens array layer 16 is deposited on the glass layer with dimensions less than the pixel size to improve light extraction efficiency.

First stratum 10 further comprises access and compensation transistors that are designed for low leakage. In some embodiments this can be by accomplished by using a thin silicon on insulator. As used in this application a thin silicon on insulator is less that 50 nm thick. Other embodiments can use a gate-all around planar or a FinFET design. Other embodiments can use a planar fully depleted silicon on insulator.

Second stratum 12 can further comprise driver transistors that are optimized for high current drive as laterally diffused metal oxide semiconductor transistors or metal-oxide-field-effect transistors on thick silicon on insulator. Here thick is understood to mean about 200 nm.

Diode sub-pixels 16 on glass 14 can be done with through-silicon vias to provide area-enhancement to achieve organic light emitting display sub-pixels of lower area as 2 μm by 2 μm having a red, green, blue white "pentile" layout.

This can be done while having pixel length 13 to be as follows. First pixel length 13A is equal to the contacted poly pitch plus twice the through-silicon via keep-out-zone plus the through-silicon via. In practice, this is about 0.5-1 μm. Second pixel length 13B is equal to one half CPP (contacted poly pitch) plus twice the through-silicon via plus margins for OLED microlens 18. In practice, this is about 0.4-0.8 μm.

Figure 2:
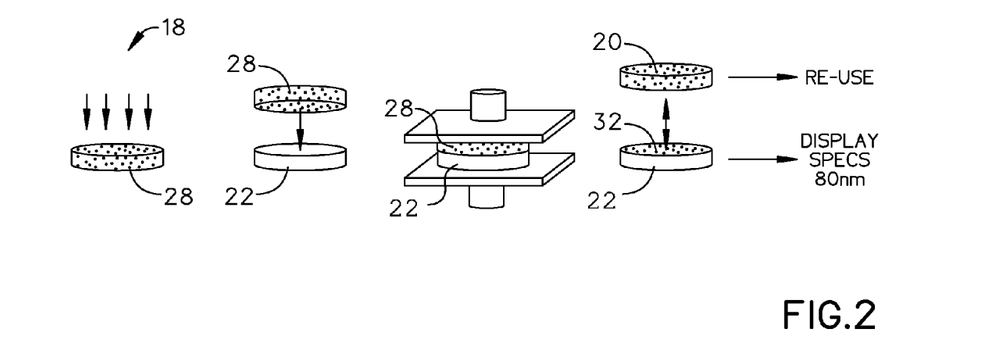
FIG. 2 is a schematic view of the silicon on glass (SiOG) display creation process.

Turning to FIG. 2, a process for implanting silicon on glass includes the following steps. First, implanting hydrogen ions 18 into silicon 28. Next, contacting silicon 28 onto glass 22. After that bonding silicon 28 to glass 22 with heat and voltage. Following that separating silicon 28 from glass 22 leaving silicon on glass layer 32 wherein the silicon on glass layer 32 is approximately 500 nm in thickness. However the glass should be less than 25 μm thick. The fusion drawing process for glass from Schott and Corning enable thinner glass films to be produced and the anodic bonding followed by hydrogen induced ex-foliation of silicon at <200 nm thicknesses is likely to be easier from a substrate handling perspective.

Turning to FIG. 3, an organic light emitting diode pixel circuit is formed with crystalline silicon transistors on an active matrix backplane (shown in FIG. 4) that is split across multiple organic light emitting diodes to form a three-dimensional organic light emitting diode pixel comprising: a first switching single crystal silicon thin film transistor T1 that is configured to receive data current IDATA through a data line. A second switching single crystal silicon thin film transistor T2 is electrically coupled to first thin film transistor T1 and configured to receive a scan voltage VSCAN through a scan line. A driving thin film transistor T3 is electrically coupled to second switching thin film transistor T2 and the organic light emitting diode and configured to receive supply voltage Vdd through a drive line. A mirror thin film transistor T4 is electrically coupled to first switching thin film transistor T1, second switching T2 thin film transistor and driving thin film transistor T3 to set a bias current for the organic light emitting diode pixel circuit. At least one storage capacitor is connected between scan line VSCAN and a ground. Switching first switching thin film transistor T1 and second switching thin film transistor T2 are configured to direct scan voltage VSCAN, supply voltage Vdd and data current IDATA to enable the organic light emitting diode to have an on state and an off state.

A second organic light emitting diode pixel circuit is arranged within second strata 12 and further comprises a second driving thin film transistor TDRIVE that is configured to receive the supply voltage $V_{DD}$ through the drive line. A third switching thin film transistor TSELECT is electrically coupled to second driving thin film transistor TDRIVE and configured to receive a write voltage through a scan line and data current IDATA through the data line. Third storage capacitor CS is connected between the drive line and third switching thin film transistor TSELECT and the drive line and the organic light emitting diode. Switching third switching thin film transistor TSELECT is configured to direct the write voltage to the organic light emitting diode in order to enable dynamic voltage scaling and high frequency pulse width modulation in the display. In some embodiments this can be used for 8K ultra high definition television, that is, a resolution of 7680×4320 (33.2 megapixels).

Turning to FIG. 5, as noted above, one advantage of this configuration is the ability to leverage pulse width modulation. As the drive voltage varies from low to high a duty cycle occurs. This can be leveraged through a two section low pass filter. The two section low pass filter can be connected to the drive line in order to control a pulse of electricity flowing through the organic light emitting diode.

As shown in FIG. 6, a non-compensated pixel circuit, includes first fully-depleted silicon-on-insulator transistor M1 that is transparent to visible light and is electrically coupled to the drive line and the organic light emitting diode. Second fully-depleted silicon-on-insulator M2 is transparent to the visible light and is electrically coupled to first fully-depleted silicon-on-insulator M1, the data line and the scan line. At least one capacitor MIM can be between first fully-depleted silicon-on-insulator M1 and second first fully-depleted silicon-on-insulator M2. In some embodiments, the at least one capacitor MIM is a metal insulator metal capacitor with capacitance density greater than 20 $fF/\mu m^2$. In some embodiments, the at least one capacitor MIM is made from one of the group consisting of: hafnium (IV) oxide, tantalum pent oxide. In this embodiment, the capacitor has area enhancement features. In some embodiments, first fully-depleted silicon-on-insulator M1 is configured to act as a pixel driver transistor to permit biasing a body of the pixel driver transistor in a forward bias mode and a reverse bias mode to compensate for parametric variation of the organic light emitting diode.

As shown in FIG. 7, a compensated pixel circuit includes a silicon-oxide-nitride-oxide-silicon charge-trapping non-volatile memory cell electrically coupled to a trim line and the data line. A first fully-depleted silicon-on-insulator M1 is electrically coupled to the scan line and the silicon-oxide-nitride-oxide-silicon charge-trapping non-volatile memory cell. A second fully-depleted silicon-on-insulator M2 is electrically coupled to the first fully-depleted silicon-on-insulator M1 and the trim line. A third fully-depleted silicon-on-insulator M3 is electrically coupled to the second fully-depleted silicon-on-insulator, the trim line and organic light emitting diode D1. The use of SONOS NVM based access transistors as voltage offset trimming structures for the organic light emitting diode pixel circuit would compensate for organic light emitting diode turn-on voltage variability, driver transistor variability.

FIG. 8 shows a graph of N-type crystalline silicon on glass and P-type crystalline silicon on glass transistor universal curves. The universal Ion-Ioff curves for the NMOS and PMOS devices show that high low-field electron mobilities greater than 500 cm2/Vs can be achieved with thin silicon on glass.

FIG. 9 shows that microlens 18 is can be made from either indium tin oxide or poly-dimethyl siloxane. The dimensions of the hemisphere are less than the pixel size in order to improve extraction efficiency. More information about this can be found at Light extraction for a doubly resonant cavity organic LED: the RC2LED which is available at: http://photonics.intec.ugent.be/download/pub_2152.pdf and is incorporated by reference.

FIG. 10 through FIG. 12 show estimated power-area distributions based on 3D silicon partitioning for a large-area (5.5" diag) ASIC with low performance transparent interconnect (4 uohm-cm) on 45 nm CMOS. Scaling the interconnect to lower resistivity materials and the CMOS technology node to finer geometries is expected to enable a product in the <500 mW total power budget regime for high bandwidth ~144 Gbps UHDTV capable displays at ~1500 ppi. It is critical to emphasize that the objective of the illustration is to show that most of the power is used to drive interconnect (metal wires) and repeaters, and that most of the area is occupied by passives such as de-coupling capacitors and white space, which enables transparent and flexible displays.

Figure 13:
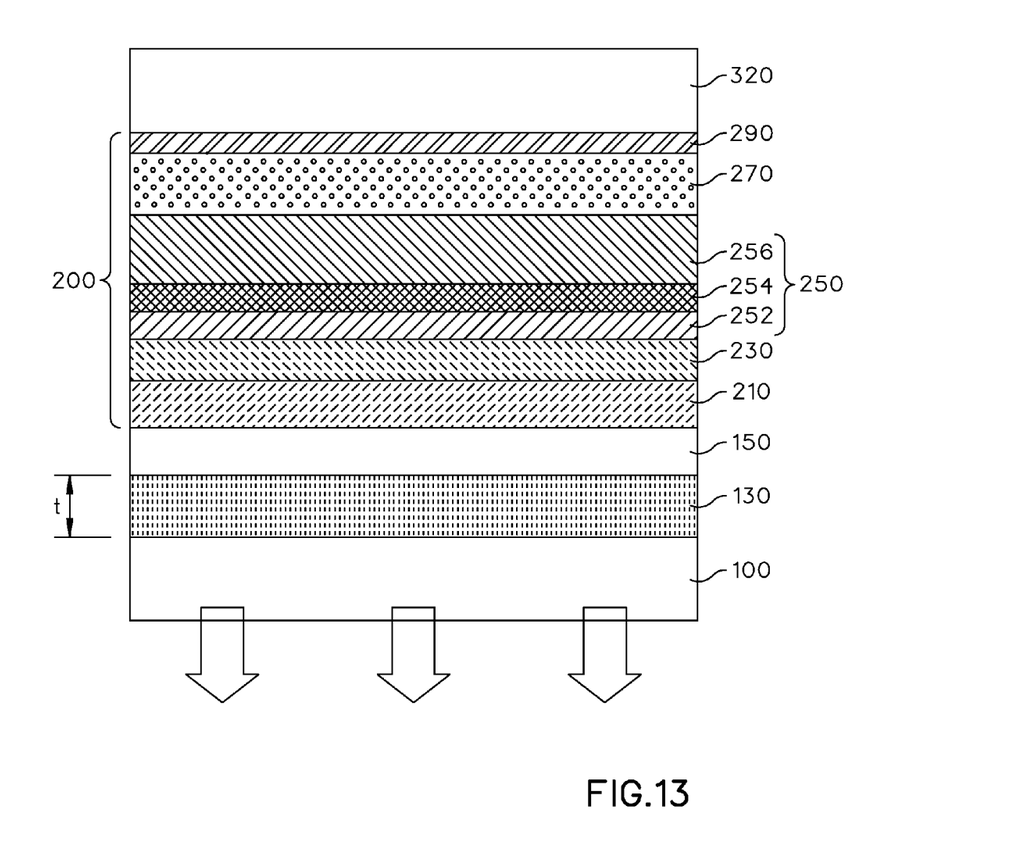
FIG. 13 shows stacking of layers of silicon.

FIG. 13 shows an example of the layers in an organic light emitting diode as explained in U.S. Pat. No. 7,750,564 which is incorporated by reference. FIG. 13 includes substrate 100, transparent electrode 150, organic light emitting layer 200, reflection electrode 320, and optical path control layer 130 provided between transparent electrode 150 and substrate 100. The dimensions of the optical path control layer are varied for the red, green and blue sub-pixels to tune the resonant frequencies of the cavity.

Substrate 100 can be a glass substrate. Transparent electrode 150 works as an anode electrode that supplies holes to organic light emitting layer 200, and can be formed of a material having high optical transmittance such as indium tin oxide (ITO) or indium zinc oxide (IZO).

Organic light emitting layer 200 includes light emitting layer 250 that can include more than one layer that generates light. In the present embodiment, organic light emitting layer 200 has a structure, in which hole injection layer 210, hole transport layer 230, light emitting layer 250, electron transport layer 270, and electron injection layer 290 are sequentially stacked. Light emitting layer 250 includes blue color light emitting layer 252, green color light emitting layer 254, and red color light emitting layer 256.

Optical path control layer 130 is formed to increase the emission of light from the OLED to the outside, and can be formed of a light transmittance material such as an organic material, an oxide material, a nitride material, or a sulfide material. That is, optical path control layer 130 can be formed of a material or a combination of materials such as Al2O3, BaO, MgO, HfO2, ZrO2, CaO2, SrO2, Y2O3, Si3N4, AlN, GaN, ZnS, or CdS. The optical transmittance of optical path control layer 130 may be approximately 90% or more in the visible light region. Also, the difference between refractive indices of optical path control layer 130 and transparent electrode 150 can be approximately 10% or less. Considering the refractive index of transparent electrode 150, optical path control layer 130 may have a refractive index in a range from 1.6 to 2.4 in the visible light region. Herein, the refractive index in the visible light region refers to the refractive index at a wavelength of 590 nm.

Reflection electrode 320 acts as a cathode electrode that supplies electrons to organic light emitting layer 200, and can be formed of a high reflective metal, for example, aluminum.

Persons of ordinary skill in the art may appreciate that numerous design configurations may be possible to enjoy the functional benefits of the inventive systems. Thus, given the wide variety of configurations and arrangements of embodiments of the present invention the scope of the invention is reflected by the breadth of the claims below rather than narrowed by the embodiments described above.

What is claimed is:

1. An organic light emitting display, comprising:
   an organic light emitting diode further comprising:
   an anode metal connected to a transparent electrode of indium tin oxide forming an indium tin oxide layer;
   a three layer organic diode stack further comprising: electron-transport layer, hole transport layer and the emission layer organized into deep trench high aspect ratio structures in a glass substrate of the organic light emitting display;
   a first stratum of thin transparent silicon, attached to the organic light emitting diode in the organic light emitting display through a high aspect ratio via;
   a second stratum of thin transparent silicon, attached to the first stratum and forming driving and addressing transistors for the devices on the first strata;
   wherein the organic light emitting diode emits light in response to bias voltages existing on the first and second strata;
   a compensated pixel circuit, further comprising:
   a silicon-oxide-nitride-oxide-silicon charge-trapping non-volatile memory cell electrically coupled to a trim line and the data line;
   a first fully-depleted silicon-on-insulator transistor electrically coupled to the scan line and the silicon-oxide-nitride-oxide-silicon charge-trapping non-volatile memory cell;
   a second fully-depleted silicon-on-insulator transistor electrically coupled to the first fully-depleted silicon-on-insulator and a power supply;
   a third fully-depleted silicon-on-insulator transistor electrically coupled to the second fully-depleted silicon-on-insulator transistor, the power supply and the organic light emitting diode;
   wherein each silicon-oxide-nitride-oxide-silicon charge-trapping non-volatile memory cell further comprises a non-volatile memory cell transistor, configured to store two bits per cell and have resistance modulated to introduce an offset in a driver bias current to compensate for manufacturing process variations in the organic light emitting diode.

2. The display of claim 1, wherein the first stratum of thin transparent silicon and the second stratum of thin transparent silicon have a thickness less than 50 nanometers.

3. The display in claim 2 where the driver transistor for the OLED pixel is a full-depleted laterally diffused metal oxide field-effect transistor p-channel enhancement mode device having a 10 m-ohm-um2 and breakdown voltage in excess of 7 volts reducing the ohmic voltage drop across the driver transistor.

4. The display in claim 3 wherein the organic light emitting diode further comprises a high aspect ratio trench having an aspect ratio of at least 10:1 in order to achieve greater emission surface area for a small pixel size; wherein the three layer organic diode stack forms a resonant optical cavity having an optical thicknesses optimized to be ¼ of a resonant wavelength of light emitted by the organic light emitting diode; wherein the resonant wavelength for red, green and blue colors is electrically tunable approximately between 380 nm and 1500 nm.

5. The display in claim 4, further comprising a dielectric spacer and metallic shield connected to the organic light emitting diode forming a doubly resonant cavity, which results in approximately 70% of emitted light escaping through the emission layer and the indium tin oxide layer of the organic light emitting diode pixel circuit.

6. The display of claim 5, wherein the organic light emitting diode further comprises a sub-pixel pitch microlens and a heremetic encapsulant layer made of poly-methyldisiloxane having a refractive index matching that of the indium tin oxide layer to improve light extraction efficiency of the emitted light from the organic light emitting diode pixel into air while preventing oxygen and moisture diffusion into the organic light emitting diode.

7. The display of claim 5 further comprising display backplane transistors that are fabricated monolithically and sequentially on a glass substrate having a thickness less than 25 um by anodic fusion bonding of crystalline silicon layers to glass and subsequent silicon thin film exfoliation at less than 400 degrees Centigrade followed by complementary metal-oxide-semiconductor processing to form the transistors in each stratum; wherein the thickness is optimized for transparency and flexibility and further has a bend radius of less than 4 millimeters without reducing carrier mobility of n-channel and p-channel enhancement mode devices.

* * * * *